United States Patent
Hui et al.

(10) Patent No.: US 6,764,929 B1
(45) Date of Patent: Jul. 20, 2004

(54) METHOD AND SYSTEM FOR PROVIDING A CONTACT HOLE IN A SEMICONDUCTOR DEVICE

(75) Inventors: Angela Hui, Fremont, CA (US); Chi Chang, Redwood City, CA (US); Mark Chang, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 42 days.

(21) Appl. No.: 10/151,625

(22) Filed: May 16, 2002

(51) Int. Cl.[7] .......................................... H01L 21/425
(52) U.S. Cl. ..................... 438/514; 438/533; 438/740
(58) Field of Search ............................. 438/514, 533, 438/663, 689, 740

(56) References Cited

U.S. PATENT DOCUMENTS

| | | | | |
|---|---|---|---|---|
| 4,732,658 A | * | 3/1988 | Lee ............................ | 438/698 |
| 5,418,174 A | * | 5/1995 | Kalnitsky ................... | 438/384 |
| 5,935,873 A | * | 8/1999 | Spuler et al. ............... | 438/710 |
| 6,136,700 A | * | 10/2000 | McAnally et al. .......... | 438/666 |

OTHER PUBLICATIONS

Van Zant, "Microchip Fabrication", pp. 198–202, © 2000.*

* cited by examiner

*Primary Examiner*—Kamand Cuneo
*Assistant Examiner*—Lisa Kilday
(74) *Attorney, Agent, or Firm*—Winstead Sechrest & Minich P.C.

(57) ABSTRACT

A method and system for providing a contact hole between structures for a semiconductor device is disclosed. The method and system comprises etching a resist material on the semiconductor device to expose a surface of the structures; providing an implant to the surface of the structures; and removing the resist material from a gap between the structures. The method and system includes annealing the semiconductor device to cause the implant to adhere to the treated surface; and providing dielectric material within the gap. Finally, the method and system includes etching the contact hole in the gap between the structures. The contact hole can then be etched without damaging the structures. Accordingly, by providing an implant treated surface and then providing an anneal process the implant is bonded to the appropriate portion of the semiconductor structure. Due to the etch difference between the implant treated device and the non-treated surface, it is possible to etch down to the bottom of the semiconductor device without damaging the gate. Since the surface around the gate structure is treated, the etch stop layer etch at a much slower rate. Therefore, there is a much larger process margin for misalignment allowance and the contact size can be larger because the dielectric material and the surface treatment protects the gate area.

10 Claims, 3 Drawing Sheets

METHOD AND SYSTEM FOR PROVIDING A CONTACT HOLE IN A SEMICONDUCTOR DEVICE

FIELD OF THE INVENTION

The present invention relates generally to semiconductor devices and more particularly to a method and system for providing a contact hole in a semiconductor device structure.

BACKGROUND OF THE INVENTION

In a conventional semiconductor process, contact holes are used extensively for providing connection between the structures on a semiconductor device. In a conventional process, an etch stop layer is provided on the semiconductor structure to allow for the contact hole to be provided after the other processing steps. This etch stop layer is utilized to create a differential between when etching the device, for example, a gate area, to provide a contact hole.

In conventional semiconductor processing, it is possible that there can be gouging created by the etch even with the etch stop layer due to misalignment issues when providing the contact etch. These misalignment issues could cause gouging into the gate area by the etch, thereby causing a short to the gate area. Accordingly, typically to minimize any possibility of a short from the source/drain (S/D) to the gate problem the distance between the area for providing the contact hole and gate is made very wide to ensure that there is no shorting that would occur. However, as device sizes become smaller and smaller, it becomes more and more difficult and will eventually become impossible to maximize the distance between the contact hole and the gate due to lithographic printing misalignment Accordingly, what is needed is a system and method for providing a contact hole which minimizes this problem, and at the same time it can provide a wider process margin, prevent the adjacent gate from being exposed, and eliminate a possible short from S/D to gate. The system should be easy to implement, cost effective, and it should be compatible with existing processes. The present invention addresses such a need.

SUMMARY OF THE INVENTION

A method and system for providing a contact hole between structures for a semiconductor device is disclosed. The method and system comprises etching a resist material on the semiconductor device to expose a surface of the structures; providing an implant to the surface of the structures; and removing the resist material from a gap between the structures. The method and system includes annealing the semiconductor device to cause the implant to adhere to the treated surface; and providing dielectric material within the gap. Finally, the method and system includes etching the contact hole in the gap between the structures. The contact hole can then be etched without damaging the structures.

Accordingly, by providing an implant treated surface and then providing an anneal process the implant is bonded to the appropriate portion of the semiconductor structure. Due to the etch difference between the implant treated material surface and the non-treated surface, it is possible to etch down to the bottom of the semiconductor device without exposing the gate. Since the surface around the gate structure is treated, the etch stop layer etching at a much slower rate than the structures during the dielectric etching step. Therefore, there is a much larger process margin for misalignment allowance and the contact size can be larger because the dielectric material and the surface treatment protects the gate area.

DETAILED DESCRIPTION

The present invention relates generally to semiconductor devices and more particularly to a method and system for providing a contact hole in a semiconductor device structure. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
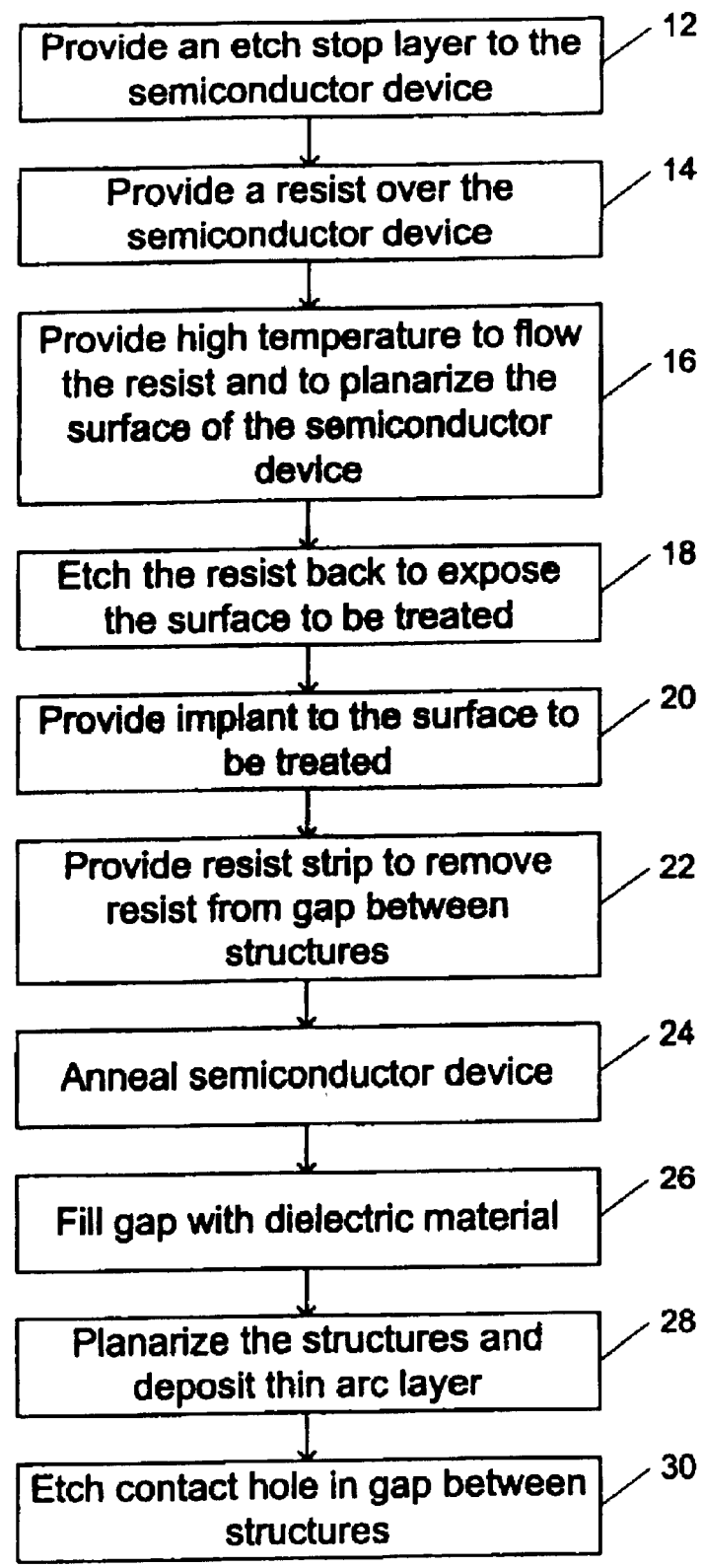
FIG. 1 is a flow chart illustrating a method in accordance with the present invention.
Figure 2:
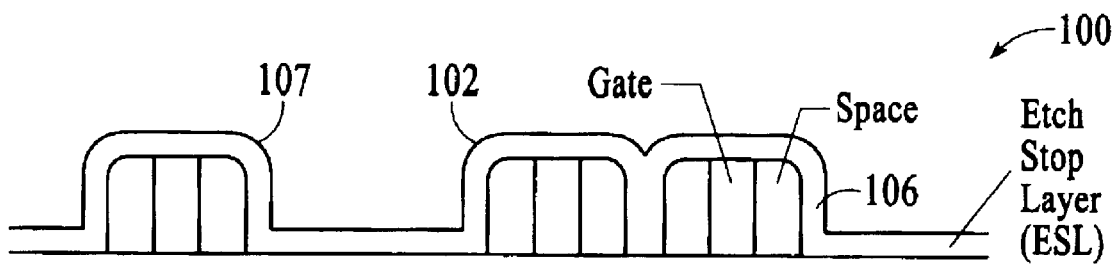
FIGS. 2–8 illustrate the semiconductor structure in accordance with the present invention after the various steps of the process.

FIG. 1 is a flow chart illustrating the method in accordance with the present invention for providing a contact hole. FIGS. 2–8 illustrate the semiconductor structure in accordance with the present invention after the various steps of the process. Referring now to FIGS. 1–8 together, (Figure 1) an etch stop layer is provided over the semiconductor device 100, via step 12. The semiconductor device 100 as seen includes gate structures 102 and 104. The etch stop layer 106 surrounds the gate structure as shown in FIG. 2. Typically, the etch stop layer would be SiN or SiON.

Figure 3:
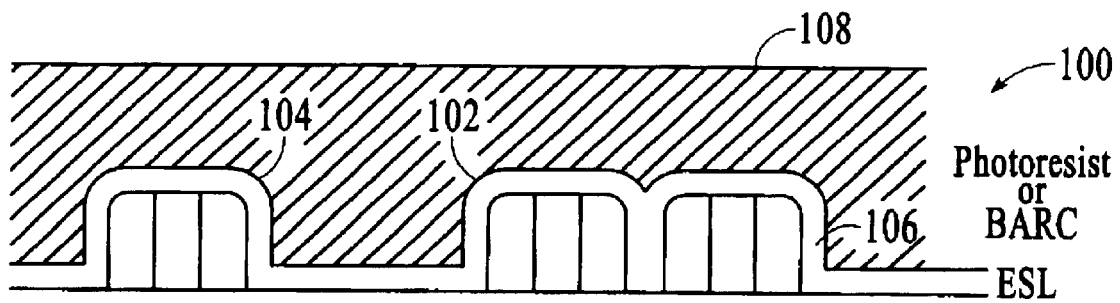

Referring now to FIGS. 1 and 3, the semiconductor device 100 is covered with a resist material 108, via step 14. The resist material could be, once again, either a photoresist or an organic BARC material. Thereafter, the coating is baked at a high temperature to flow the resist and planarize the surface, via step 16.

Figure 4:
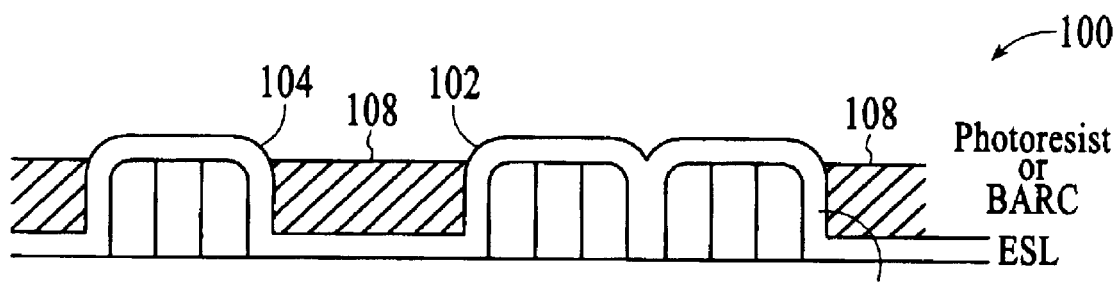
Figure 5:
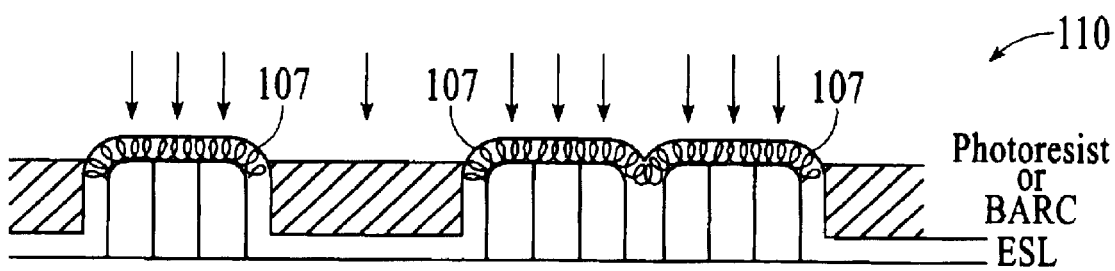
Figure 6:
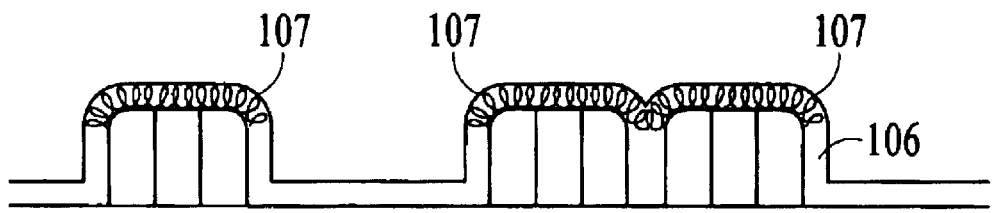

Next, the photoresist or BARC material is controllably etched back as shown in FIG. 4 to expose the surface of the top gate for the surface treatment, via step 18. Referring now to FIGS. 1 and 5, an implant process is applied to treat the desired location of the etch stop layer shown at 107. Thereafter, a resist strip is provided to remove the photoresist or BARC layer, and an anneal process at high temperature (400–900 C) is provided to make sure the species is bonded to the ESL layer (FIG. 6), via step 20.

Figure 7:
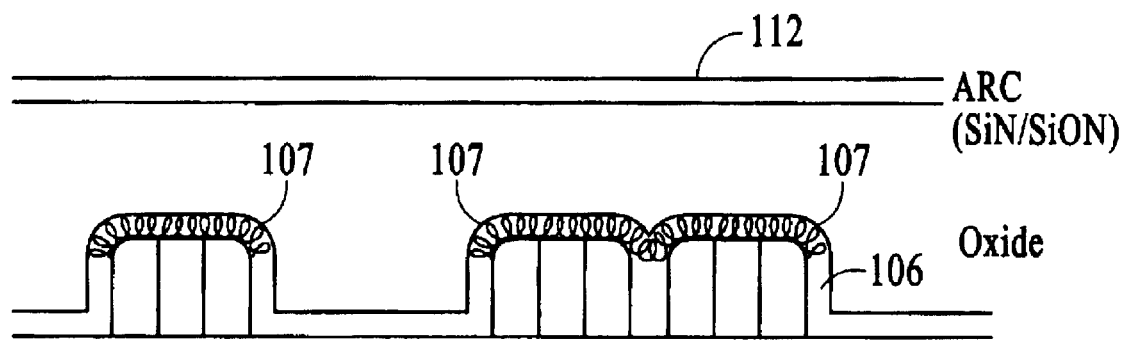
Figure 8:
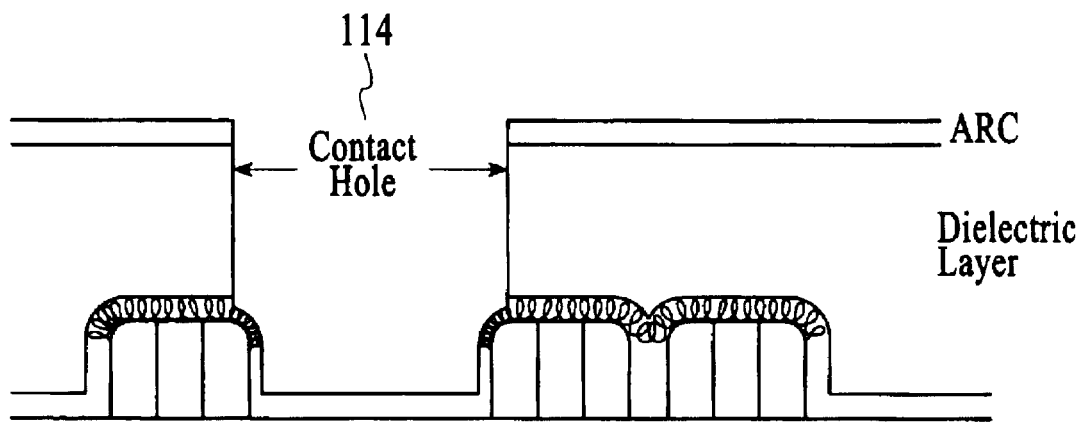

The gap is then filled once again with dielectric material 112 as shown in FIG. 7, via step 22. The material could be HDP oxide, TEOS, BPTEO or a combined film stacks. Thereafter, a chemical/mechanical polishing is provided to planarize the film stacks and deposit a thin ARC layer for the contact mask, via step 24. Next, a contact hole etch is then provided to the dielectric layer between the two gate structures (FIG. 8), via step 26.

Accordingly, by providing an implant treated surface and then providing an anneal process the implant is bonded to the appropriate portion of the semiconductor structure. Due to the etch difference between the implant treated surface and the non-treated surface, it is possible to etch down to the bottom of the semiconductor device with the treated etch stop layer being utilized to protect the gate. Since the etch stop layer surface around the gate structure is treated, the etch stop layer etches with a much slower rate and hence of gate is properly protected from been exposed. Therefore, there is a much larger process margin for misalignment allowance and the contact size can be relaxed with larger contact size because the dielectric material and the surface treatment protects the gate area.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a contact hole between structures for a semiconductor device, comprising the steps:

(a) etching a insist material on the semiconductor device to expose a surface of the structures;

(b) providing an implant to treat a location the surface of the structures;

(c) removing the resist material form a gap between the structures;

(d) annealing the semiconductor device to cause the implant to adhere to the treated surface;

(e) providing dielectric material within the gap; and (f) etching the contact hole in the gap between the structures, wherein the contact hole can be etched without damaging the structures and wherein the implant treated surface is protected.

2. The method of claim 1 wherein the semiconductor device includes an etch stop layer.

3. The method of claim 2 wherein the etch stop layer etches at a much slower rate than the structures.

4. The method of claim 1 wherein the resist comprises a photoresist.

5. The method of claim 1 wherein the resist comprises an organic material.

6. The method of claim 1 wherein the structures comprise gate structures.

7. The method of claim 1 wherein the resist etching step (a) further comprises the step of providing a high temperature to flow the resist and to planarize the surface of the semiconductor device.

8. The method of claim 1 wherein the dielectric providing step (e) further includes the steps of (e1) planarizing the structures and (e2) depositing an ARC layer on the structures.

9. A method for providing a contact hole in a semiconductor device comprising the steps of:

providing an etch stop layer over a plurality of gale structures of said semiconductor device, covering said etch stop layer with a resist material;

baking said resist material in order to flow said resist and planarize a surface of said semiconductor device;

etching said resist material to expose a surface of a gate structure of said semiconductor device for treatment leaving a remaining portion of said resist material;

providing an implant to treat a location on said etch stop layer, removing said remaining portion of said resist material;

annealing said semiconductor device to bond said implant to said location on said etch stop layer;

filling a gap between two gate structures in said semiconductor device with a dielectric material;

depositing an anti-reflective coating layer over said dielectric material; and etching a contact hole in said gap.

10. The method as recited in claim 9, wherein said implant causes said etch stop layer to be etched at a slower rate.

* * * * *

UNITED STATES PATENT AND TRADEMARK OFFICE
CERTIFICATE OF CORRECTION

PATENT NO.    : 6,764,929 B1
DATED         : July 20, 2004
INVENTOR(S)   : Angela Hui, Chi Chang and Mark Chang Page 1 of 1

It is certified that error appears in the above-identified patent and that said Letters Patent is hereby corrected as shown below:

Column 3,
Line 20, please replace "insist" with -- resist --.
Line 22, following "location" please insert -- on --.

Column 4,
Line 15, please replace "gale" with -- gate --.
Line 24, please replace "," with -- ; --.

Signed and Sealed this

Fifth Day of April, 2005

JON W. DUDAS
*Director of the United States Patent and Trademark Office*